(12) United States Patent
Kim et al.

(10) Patent No.: US 10,504,568 B2
(45) Date of Patent: *Dec. 10, 2019

(54) INTEGRATED CIRCUIT MEMORY DEVICES WITH CUSTOMIZABLE STANDARD CELL LOGIC

(71) Applicant: Samsung Electronics Co., Ltd., Suwon-si, Gyeonggi-do (KR)

(72) Inventors: Jin-Hyun Kim, Yongin-si (KR); Won-Hyung Song, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/193,527

(22) Filed: Nov. 16, 2018

(65) Prior Publication Data

US 2019/0087364 A1 Mar. 21, 2019

Related U.S. Application Data

(63) Continuation of application No. 15/346,342, filed on Nov. 8, 2016, now Pat. No. 10,162,771.

(30) Foreign Application Priority Data

Nov. 9, 2015 (KR) .......................... 10-2015-0156823

(51) Int. Cl.
| | |
|---|---|
| *G11C 7/10* | (2006.01) |
| *G11C 11/4096* | (2006.01) |
| *G06F 17/50* | (2006.01) |
| *G06F 13/40* | (2006.01) |
| *G06F 13/16* | (2006.01) |
| *G11C 5/02* | (2006.01) |

(52) U.S. Cl.
CPC ........ *G11C 7/1006* (2013.01); *G06F 13/1668* (2013.01); *G06F 13/4068* (2013.01); *G06F 17/5072* (2013.01); *G06F 17/5077* (2013.01); *G11C 5/025* (2013.01); *G11C 11/4096* (2013.01); *Y02D 10/14* (2018.01); *Y02D 10/151* (2018.01)

(58) Field of Classification Search
CPC ............. G06F 13/1668; G06F 17/5077; G06F 17/5072; G06F 13/4068; G11C 7/1006; G11C 5/025; G11C 11/4096; Y02D 10/151; Y02D 10/14
See application file for complete search history.

(56) References Cited

U.S. PATENT DOCUMENTS

| | | | | |
|---|---|---|---|---|
| 5,530,944 A | ‡ | 6/1996 | Stones | ................ G06F 13/1689 711/10 |
| 5,636,367 A | ‡ | 6/1997 | Stones | ................ G06F 13/1689 710/58 |

(Continued)

*Primary Examiner* — Ajay Ojha
(74) *Attorney, Agent, or Firm* — Myers Bigel, P.A.

(57) ABSTRACT

Provided are a semiconductor device and a semiconductor system. A semiconductor device includes a memory cell array; a standard cell region in which first type standard cells implemented to perform a first operation for accessing the memory cell array and second type standard cells performing the first operation and having performance characteristics different from performance characteristics of the first type standard cells are arranged; and a ROM including a program that performs place and route for the standard cells arranged in the standard cell region.

10 Claims, 13 Drawing Sheets

(56) References Cited

U.S. PATENT DOCUMENTS

| | | | |
|---|---|---|---|
| 6,211,695 B1 ‡ | 4/2001 | Agrawal | H03K 19/17728 326/38 |
| 6,966,044 B2 ‡ | 11/2005 | Reuland | G06F 17/5045 716/11 |
| 7,707,330 B2 ‡ | 4/2010 | Rao | G11C 7/10 370/41 |
| 7,710,144 B2 ‡ | 5/2010 | Dreps | G06F 13/4086 326/30 |
| 8,645,893 B1 ‡ | 2/2014 | Yeung | G06F 17/5068 716/119 |
| 8,930,647 B1 ‡ | 1/2015 | Smith | G06F 9/44557 711/15 |
| 2004/0223401 A1 ‡ | 11/2004 | Miyamoto | G06F 17/505 365/232 |
| 2005/0251617 A1 ‡ | 11/2005 | Sinclair | G06F 3/061 711/10 |
| 2007/0214444 A1 ‡ | 9/2007 | Nakai | G11C 5/02 716/113 |
| 2010/0164099 A1 ‡ | 7/2010 | Sosogi | G11C 5/025 257/737 |
| 2015/0227324 A1 ‡ | 8/2015 | Amer | G11C 7/1051 711/10 |
| 2015/0228327 A1 ‡ | 8/2015 | Seo | G11C 29/022 365/96 |
| 2015/0228340 A1 ‡ | 8/2015 | Best | G06F 12/0638 711/10 |

‡ imported from a related application

1200

1300

1400

INTEGRATED CIRCUIT MEMORY DEVICES WITH CUSTOMIZABLE STANDARD CELL LOGIC

REFERENCE TO PRIORITY APPLICATION

This application is a continuation of U.S. patent application Ser. No. 15/346,342, filed Nov. 8, 2016, which claims priority from Korean Patent Application No. 10-2015-0156823, filed Nov. 9, 2015 in the Korean Intellectual Property Office, the disclosures of which are hereby incorporated herein by reference.

BACKGROUND

1. Field of the Inventive Concept

The present inventive concept relates to semiconductor memory devices and systems and methods of operating same.

2. Description of the Prior Art

A required memory capacity or operating speed of a memory device may differ in accordance with various applications. Particularly, in accordance with various product requirements, such as IoT (Internet of Things) that is recently noticed, control of the capacity and/or performance of a memory device, for example, the operating speed, operation latency and/or power consumption of the memory device, may be required. In order to cope with such requirements, there may be a need for a semiconductor device that can optimize the function and the operating condition thereof in accordance with a user's requirements (i.e., applications) without greatly deviating from the structure of the existing memory device.

SUMMARY

One subject to be solved by the present inventive concept is to provide semiconductor devices and systems that can customize the memory performance using standard cell logic.

According to an embodiment of the present disclosure, there is provided a semiconductor device including a memory cell array, a standard cell region in which first type standard cells are implemented to perform a first operation for accessing the memory cell array and second type standard cells are implemented to perform the first operation, but with different performance characteristics relative to the first type standard cells, and a read-only memory (ROM) containing a program that supports operations to place and route the standard cells arranged in the standard cell region.

According to another aspect of the present disclosure, there is provided a semiconductor device including: (i) a memory cell array, (ii) a standard cell region in which first type standard cells are arranged to define a critical operational path for accessing the memory cell array and second type standard cells are arranged to provide a user-defined operational path for accessing the memory cell array, and (iii) a read-only memory (ROM), which contains a program that performs place and route for the standard cells arranged in the standard cell region.

According to additional embodiments of the invention, an integrated circuit device is provided that contains a memory cell array in a semiconductor substrate and standard cell logic electrically coupled to the memory cell array. The standard cell logic can include a first plurality of standard cells configured to support first write and/or first read operations in the memory cell array and a second plurality of standard cells configured to support second write and/or second read operations in the memory cell array, which have different performance characteristics relative to performance characteristics associated with the first write and/or read operations.

According to some of these embodiments of the invention, the first plurality of standard cells have different latency and/or operating speed and/or power consumption characteristics relative to the second plurality of standard cells. According to additional embodiments of the invention, a read-only memory (ROM) is provided, which is electrically coupled to the standard cell logic. In addition, input/output (I/O) pins are provided along with first I/O standard cells (within the standard cell logic). According to some of these embodiments of the invention, the first I/O standard cells are configured to establish a first number (N1) of the I/O pins as active and a second number (N2) of the I/O pins as inactive, in accordance with I/O pin programming information contained in the ROM. In these embodiments, the first number N1 is selected from a group consisting of 8, 16 and 32 and the second number N2 is selected from a group consisting of 0, 16 and 24. According to additional embodiments of the invention, the memory cell array includes a plurality of memory banks and the standard cell logic includes a memory bank standard cell logic, which is configured to set a number of active memory banks in the plurality of memory banks, in response to programming information contained in said ROM.

According to additional embodiments of the invention, an integrated circuit device is provided that contains a memory cell array in a semiconductor substrate along with standard cell logic, which is electrically coupled to the memory cell array. The standard cell logic includes a first plurality of standard cells, which are configured to support a first operational path for accessing the memory cell array, and a second plurality of standard cells, which are configured to support a second user-programmable operational path for accessing the memory cell array. A programmable read-only memory (PROM) is provided, which is electrically coupled to the standard cell logic and configured to support a program of instructions that specifies the user-programmable operational path. The PROM may further be configured to support a program of operations to be performed by the standard cell logic. These operations may be selected from a group consisting of memory copy, pop count and auto read modify write operations.

Additional advantages, subjects, and features of the inventive concept will be set forth in part in the description which follows and in part will become apparent to those having ordinary skill in the art upon examination of the following or may be learned from practice of the inventive concept.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE EMBODIMENTS

Figure 1:
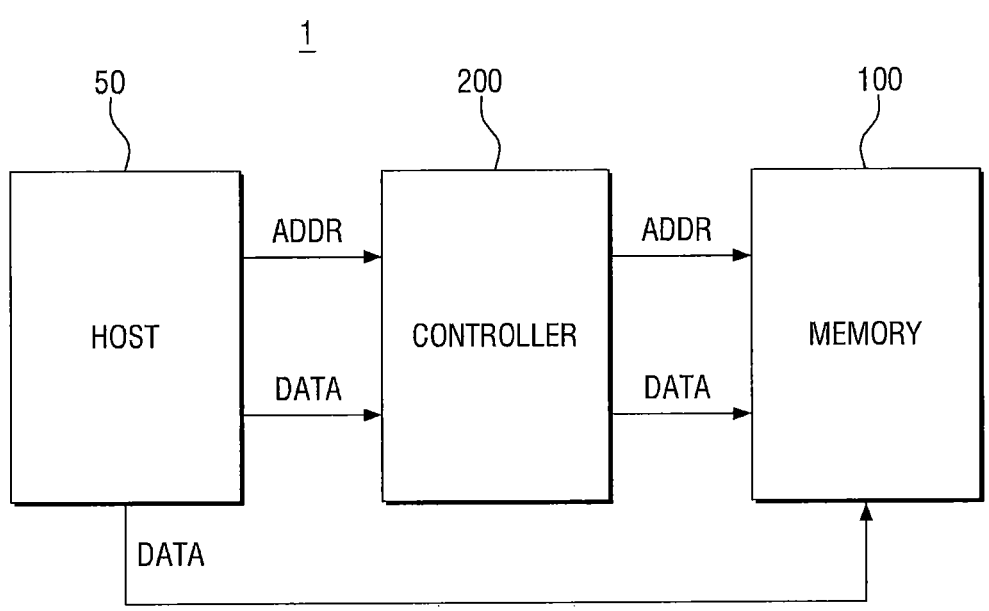
FIG. 1 is a schematic diagram explaining a semiconductor memory system according to an embodiment of the present inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Advantages and features of the present inventive concept and methods of accomplishing the same may be understood more readily by reference to the following detailed description of preferred embodiments and the accompanying drawings.

Hereinafter, preferred embodiments of the present inventive concept will be described with reference to the accompanying drawings.

FIG. 1 is a schematic diagram explaining a semiconductor system according to an embodiment of the present inventive concept. Referring to FIG. 1, a semiconductor system 1 according to an embodiment of the present inventive concept may include a host device 50, a memory device 100, and a memory controller 200. The host device 50 transmits a memory access request (i.e., command) to the memory controller 200. The memory access request may include a request to read data stored in the memory device 100 or a request to write data in the memory device 100. The memory access request may include address information ADDR and data DATA. For example, if the memory access request corresponds to a read request, the memory access request may include memory address information to read the data stored in the memory device 100. Alternatively, if the memory access request corresponds to a write request, the memory access request may include data to be stored in the memory device 100 and memory address information to store the data in the memory device 100.

In some embodiments of the present inventive concept, the host device 50 may be one of various types of computing devices including a personal computer, a server computer, a notebook computer, and a tablet computer. However, the scope of the present inventive concept is not limited thereto, and the host device 50 may include a certain electronic device or electronic circuit that can generate a request to read/write data in the memory device 100.

The memory controller 200 controls the memory device 100. The memory controller 200 receives a memory access request from the host device 50, and transmits the memory access request to the memory device 100. The memory access request, which the memory controller 200 transmits to the memory device 100, may also include address information ADDR and data DATA. For example, if the memory access request corresponds to a read request, the memory access request may include memory address information to read the data stored in the memory device 100. Alternatively, if the memory access request corresponds to a write request, the memory access request may include data to be stored in the memory device 100 and memory address information to store the data in the memory device 100.

In some embodiments of the present inventive concept, if the memory access request corresponds to the write request, data to be stored in the memory device 100 may be directly transferred from the host device 50 to the memory device 100 without passing through the memory controller 200.

The memory device 100 performs a memory access operation with respect to the memory access request under the control of the memory controller 200. In some embodiments of the present inventive concept, the memory device 100 may include a DRAM (Dynamic Random Access Memory). However, the scope of the present inventive concept is not limited thereto, and the memory device 100 may include a volatile memory or a nonvolatile memory.

Figure 2:
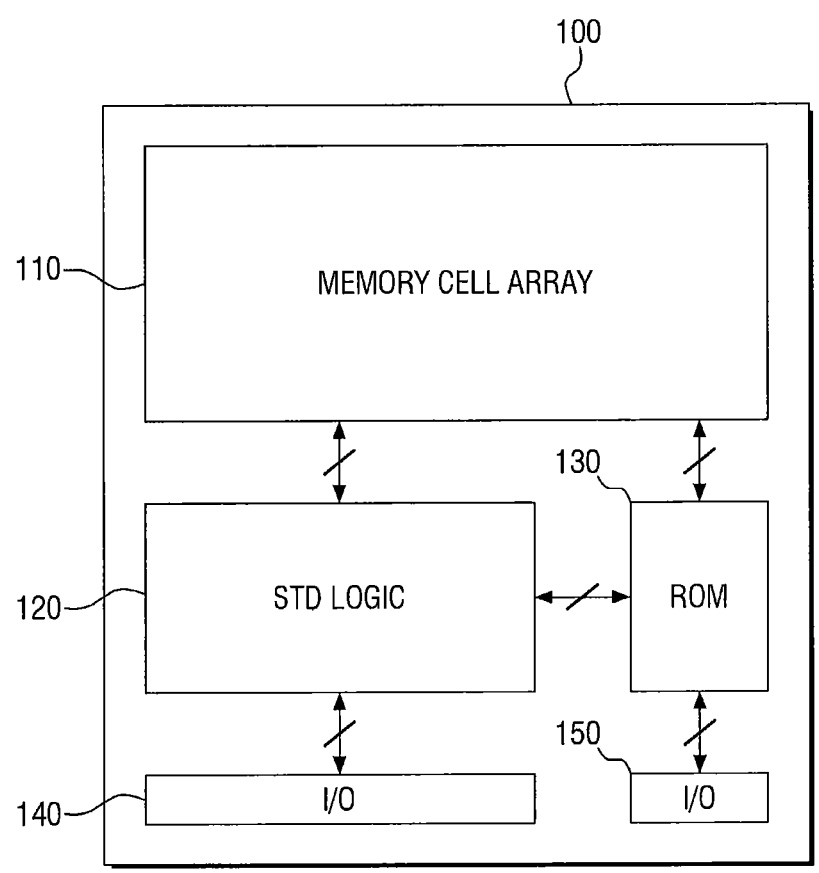
FIG. 2 is a schematic diagram explaining a semiconductor memory device according to an embodiment of the present inventive concept.
Figure 3:
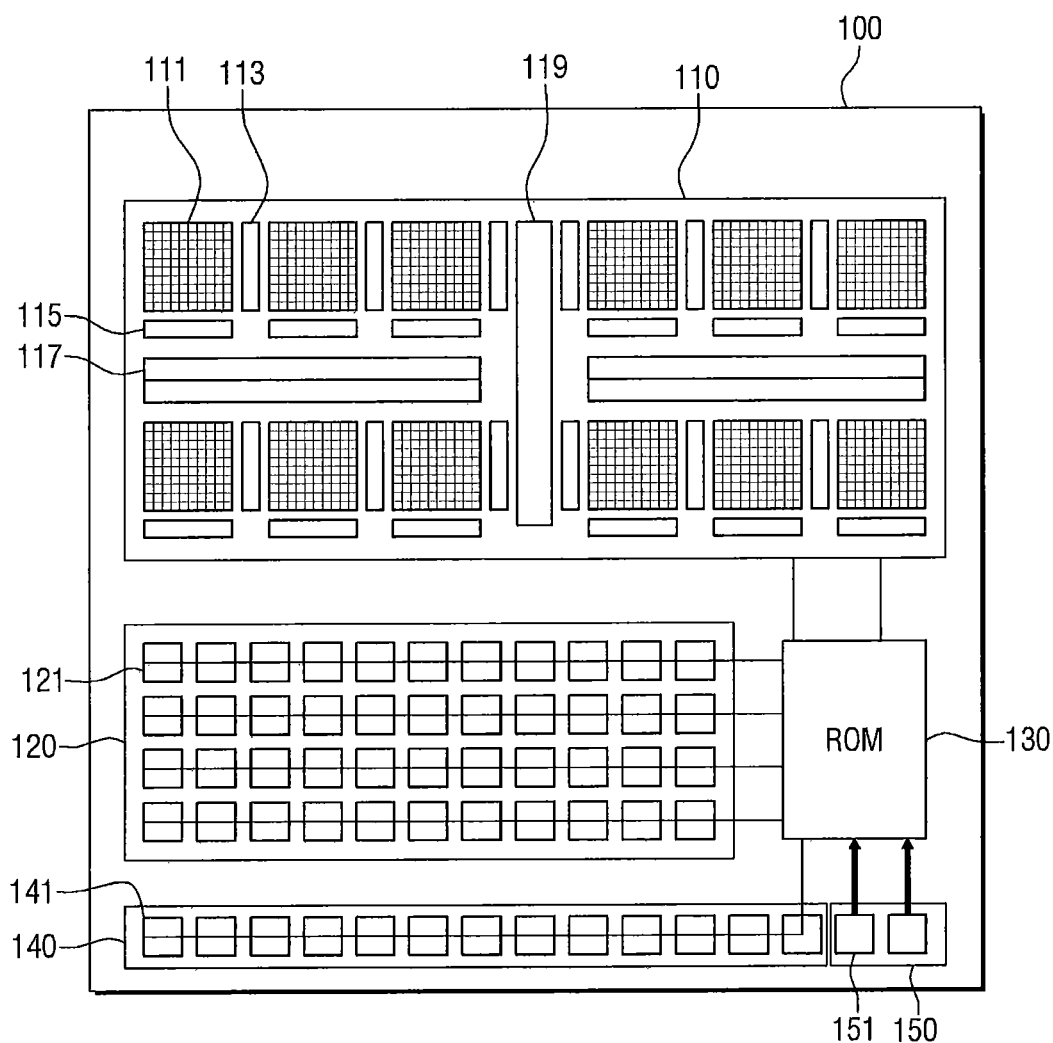
FIG. 3 is a schematic diagram explaining a semiconductor memory device according to an embodiment of the present inventive concept.

FIGS. 2 and 3 are schematic diagrams explaining a semiconductor device according to an embodiment of the present inventive concept. Referring to FIGS. 2 and 3, a semiconductor device 100 according to an embodiment of the present inventive concept may include a memory cell array 110, a standard cell region 120, a ROM (Read Only Memory) 130, a first I/O (Input/Output) region 140, and a second I/O region 150.

The memory cell array 110 includes a plurality of memory cells 111 in which data is actually stored. In some embodiments of the present inventive concept, the memory cell array 110 may include a plurality of banks. For example, a bank includes a memory cell 111, a row decoder 113, and a column decoder 115, and may form one memory access unit in the memory cell array 110. Specifically, the memory cell array 110 includes selection circuits 117 and 119 that can select a specific bank among a plurality of banks. For example, the first selection circuit 119 may select memory cells 111 arranged on a left half region of the memory cell array 110 in FIG. 3, or may select memory cells 111 arranged on a right half region. If the first selection circuit 119 selects the left half region of the memory cell array 110 in FIG. 3, the second selection circuit 117 may select memory cells 111 arranged on an upper portion of the left half region of the memory cell array 110 or memory cells 111 arranged on a lower portion of the left half region. That is, the selection circuits 117 and 119 can activate or inactivate the memory cell array 110 in the unit of a bank, and they may be controlled by some standard cells included in the standard cell region 120 to be described later.

The standard cell region 120 includes a plurality of standard cells 121 that enable the memory device 100 to perform a memory access operation. The standard cell is a kind of circuit to provide a specific function, and it includes a plurality of transistors and interconnections. Here, the specific function may be, for example, a Boolean logic function or a storage function. An example of the Boolean logic function may be a logic operation of AND, OR, XOR, XNOR, or inversion, and an example of the storage function may be a logic operation of flip-flop or latch. In various embodiments of the present inventive concept, the standard cells 121 arranged in the standard cell region 120 may be designed to implement their inherent functions, and specifically, functions that are necessary for the memory access operation.

The ROM 130 includes a program that performs place and route operation for the standard cells 121 arranged in the standard cell region 120. Specifically, in accordance with the application purposes of the memory device 100, the program stored in the ROM 130 may select the standard cells 121 arranged in the standard cell region 120 that determines the operation of the memory device 100, and may form a connection so that the selected standard cells 121 are electrically connected to each other.

The first I/O region 140 is a region of the memory device 100 in which a command for accessing the memory cell array 110, address information, and data are input/output. The first I/O region 140 is connected to first I/O pins that are exposed on a package. Here, the first I/O region according to various embodiments of the present inventive concept may include I/O pin standard cells 141 that determine the number of active pins among the first I/O pins. That is, the number of pins of the memory device 100 may be determined depending on which I/O pin standard cells among the I/O pin standard cells 141 arranged in the first I/O region 140 the program stored in the ROM 130 performs place and route for.

The second I/O region 150 is a region that is used to store the program that performs place and route for the ROM 130. The second I/O region 150 is connected to second I/O pins that are exposed on the package. That is, the second I/O pins electrically connect the ROM 130 to an external device that is connected to the memory device 100, so that the program is transmitted from the external device to the ROM 130. Here, the second I/O region 150 according to various embodiments of the present inventive concept may include I/O pin standard cells 151 that determine the number of active pins among the second I/O pins.

Figure 4:
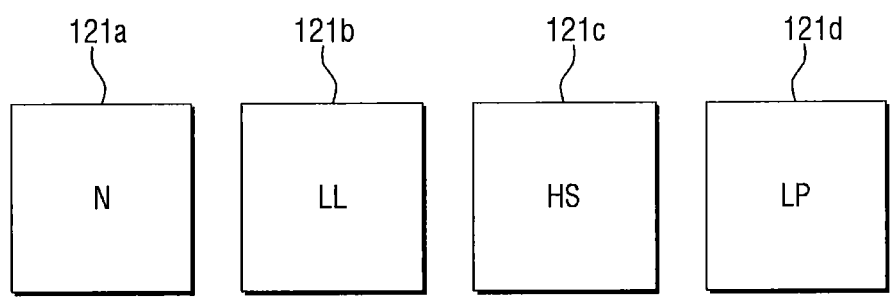
FIG. 4 is a schematic diagram explaining a standard cell type that is used in a semiconductor memory device according to an embodiment of the present inventive concept.

FIG. 4 is a schematic diagram explaining a standard cell type that is used in a semiconductor device according to an embodiment of the present inventive concept. Referring to FIG. 4, the standard cells used in a semiconductor device according to an embodiment of the present inventive concept may include two or more standard cell types.

On the standard cell region 120 of the memory device 100, a first type standard cell 121a and second type standard cells 121b, 121c, and 121d that are different from the first type standard cell 121a may be arranged. The first type standard cell 121a may be implemented to perform a first operation for accessing the memory cell array 110, i.e., memory operation. The second type standard cells 121b, 121c, and 121d may be implemented to perform the first operation that is the same as that of the first type standard cell 121a in a state where they have the performance characteristics that are different from those of the first type standard cell 121a.

For example, the second type standard cell 121b may be a standard cell which performs the same operation as the operation of the first type standard cell 121a, but has the latency characteristics that are different from those of the first type standard cell 121a. If a main requirement is to operate with lower latency than other performances in an application environment of the memory device 100, the second type standard cell 121b may be placed and routed in an operational path of the memory device instead of the first type standard cell 121a.

As another example, the second type standard cell 121c may be a standard cell which performs the same operation as the operation of the first type standard cell 121a, but has the operating speed characteristics that are different from those of the first type standard cell 121a. If a main requirement is to operate at higher speed than other performances in an application environment of the memory device 100, the second type standard cell 121c may be placed and routed in the operational path of the memory device instead of the first type standard cell 121a.

As still another example, the second type standard cell 121d may be a standard cell which performs the same operation as the operation of the first type standard cell 121a, but has the power consumption characteristics that are different from those of the first type standard cell 121a. If a main requirement is to operate with lower power consumption than other performances in an application environment of the memory device 100, the second type standard cell 121d may be placed and routed in the operational path of the memory device instead of the first type standard cell 121a.

Figure 5:
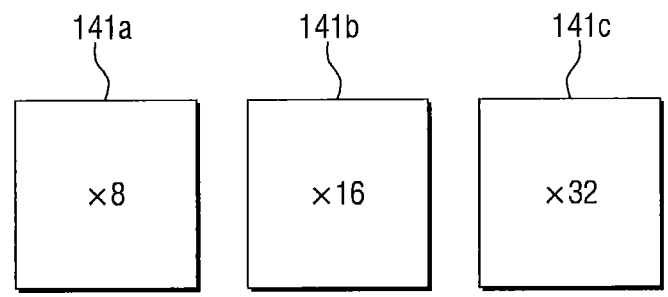
FIG. 5 is a schematic diagram explaining a standard cell type that is used in a semiconductor memory device according to another embodiment of the present inventive concept.

FIG. 5 is a schematic diagram explaining a standard cell type that is used in a semiconductor device according to another embodiment of the present inventive concept. Referring to FIG. 5, the standard cells used in a semiconductor device according to another embodiment of the present inventive concept may include two or more standard cell types. In the first I/O region 140 of the memory device 100, I/O pin standard cells 141a, 141b, and 141c may be arranged. These I/O pin standard cells 141a, 141b, and 141c may differently set the number of active pins among the first I/O pins.

For example, the I/O pin standard cell 141a may be an 8-pin standard cell, the I/O pin standard cell 141b may be a 16-pin standard cell, and the I/O pin standard cell 141c may be a 32-pin standard cell. In these standard cells, the numbers of active pins among the first I/O pins may be set to 8, 16, and 32, respectively.

In some embodiments of the present inventive concept, the active pins that are set by the I/O pin standard cells 141a, 141b, and 141c may coincide with the interface of a memory in the related art, such as a DRAM. In other words, through transmission of commands used in the memory in the related art, such as the DRAM, to meet the timing that is supported in the memory in the related art, compatibility can be secured between the semiconductor device according to various embodiments of the present inventive concept and the memory controller in the related art.

Figure 6:
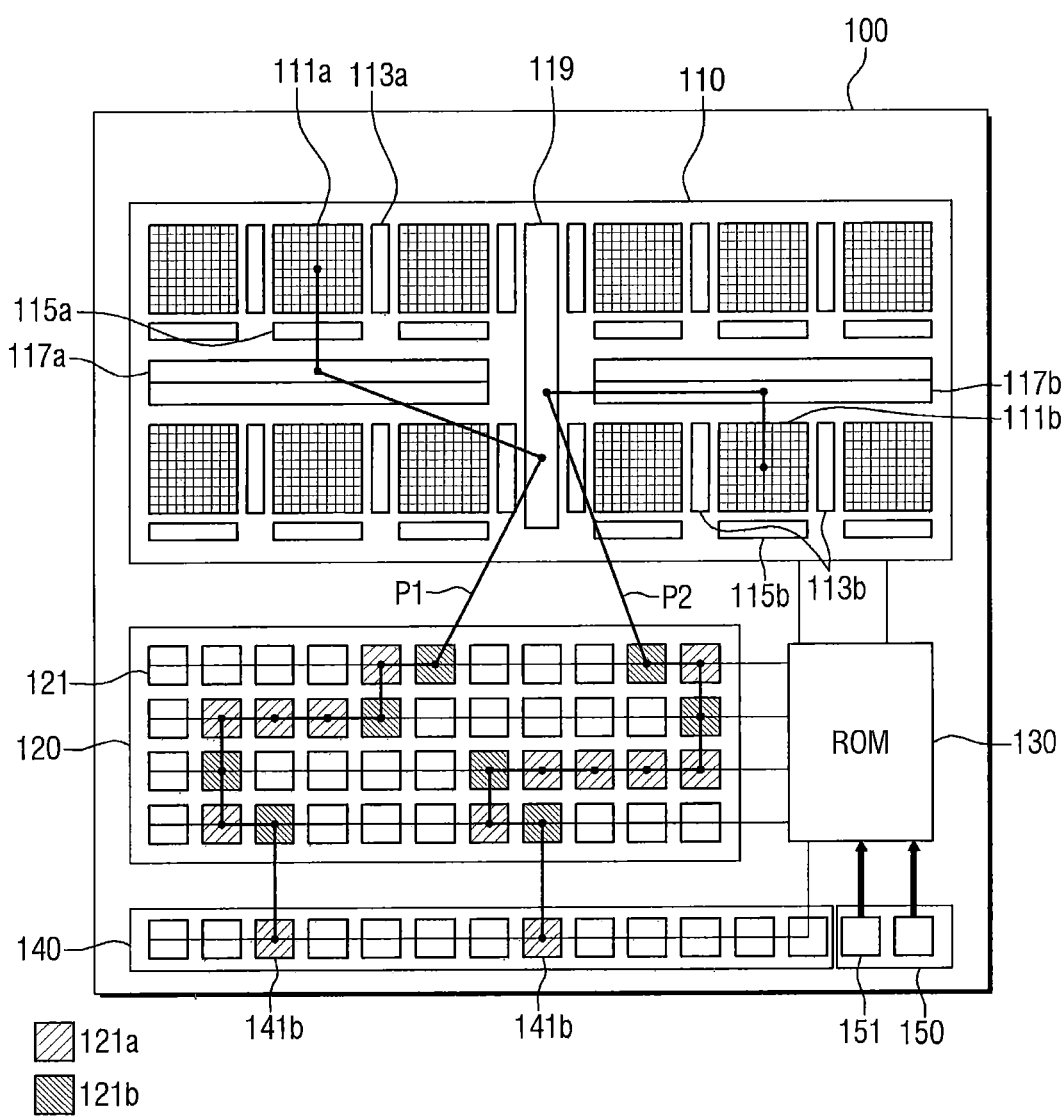
FIG. 6 is a schematic diagram explaining a semiconductor memory device according to an embodiment of the present inventive concept.

FIG. 6 is a schematic diagram explaining a semiconductor device according to an embodiment of the present inventive concept. Referring to FIG. 6, a semiconductor device 100 according to an embodiment of the present inventive concept includes a first type standard cell 121a and a low-latency standard cell 121b that is a second type standard cell that is different from the first type standard cell 121a in a standard cell region 120. On the other hand, the semiconductor device 100 includes a 16-pin standard cell 141b that is an I/O pin standard cell in a first I/O region 140. Of course, an additional standard cell that performs a different function from the function of the first type standard cell 121a or the second type standard cell 121b may be further included in the standard cell region 120.

A program stored in a ROM 130 may define operational paths P1 and P2 of the semiconductor device through performing of place and route for any one of the first type standard cell 121a and the second type standard cell 121b and the additional standard cell. Here, a program stored in the ROM 130 may perform place and route in a normal mode or a customized mode. In the case where the program performs the place and route in the normal mode, the program stored in the ROM 130 may define the operational path through performing of the place and route for the first type standard cell 121a and the additional standard cell. In contrast, in the case where the program performs the place and route in the customized mode, the program may define the operational paths P1 and P2 through performing of the place and route for the second type standard cell 121b and the additional standard cell.

The memory device 100 according to various embodiments of the present inventive concept may further include a memory bank standard cell that determines the number of active banks among a plurality of banks in the standard cell region 120. Specifically, the memory bank standard cell may include a first memory bank standard cell and a second memory bank standard cell, and the first memory bank standard cell and the second memory bank standard cell may be set to have different numbers of active banks. For example, the first memory bank standard cell may activate a memory cell 111a and the second memory bank standard cell may activate a memory cell 111b.

Here, a program stored in the ROM 130 may determine the memory capacity of the memory device 100 through adjustment of the number of active banks that is set by the memory bank standard cell as described above. For example, the program may set the capacity of the memory device 100 to 1 Gb, 2 Gb, or 4 Gb by properly performing place and route for the memory bank standard cell.

Figure 7:
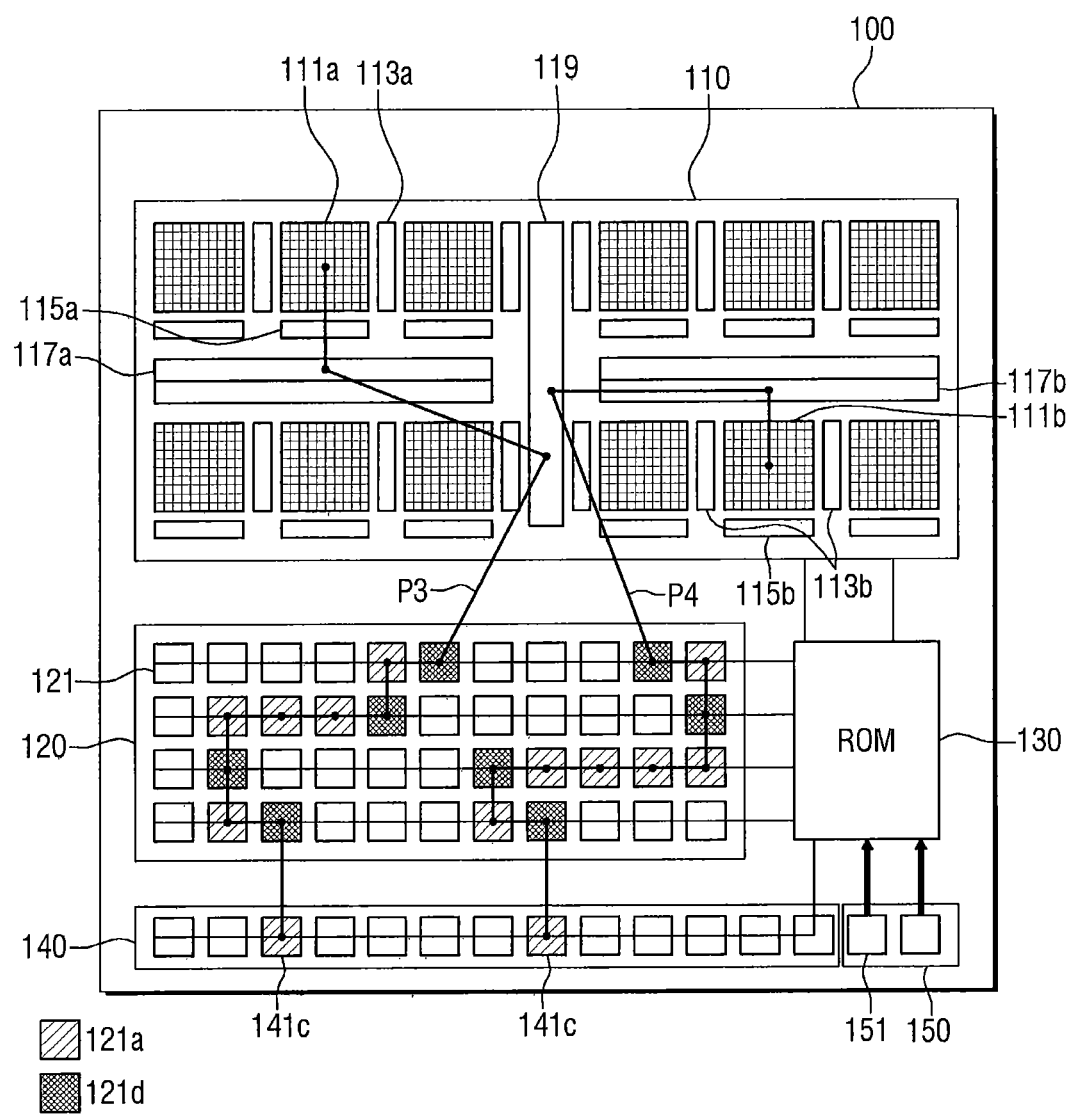
FIG. 7 is a schematic diagram explaining a semiconductor memory device according to another embodiment of the present inventive concept.

FIG. 7 is a schematic diagram explaining a semiconductor device according to another embodiment of the present inventive concept. Referring to FIG. 7, a semiconductor device 100 according to another embodiment of the present inventive concept includes a first type standard cell 121a and a low-power standard cell 121d that is a second type standard cell that is different from the first type standard cell 121a in a standard cell region 120. On the other hand, the semiconductor device 100 includes a 32-pin standard cell 141c that is an I/O pin standard cell in a first I/O region 140. Of course, an additional standard cell that performs a different function from the function of the first type standard cell 121a or the second type standard cell 121d may be further included in the standard cell region 120.

A program stored in a ROM 130 may define operational paths P3 and P4 of the semiconductor device through performing of place and route for any one of the first type standard cell 121a and the second type standard cell 121d and the additional standard cell.

Here, in the case where the program performs the place and route in the normal mode, the program may define the operational path through performing of the place and route for the first type standard cell 121a and the additional standard cell. In contrast, in the case where the program performs the place and route in the customized mode, the program may define the operational paths P3 and P4 through performing of the place and route for the second type standard cell 121d and the additional standard cell.

Figure 8:
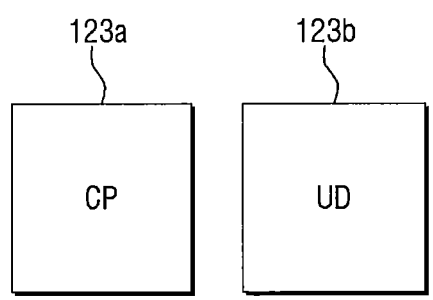
FIG. 8 is a schematic diagram explaining a standard cell type that is used in a semiconductor memory device according to still another embodiment of the present inventive concept.

FIG. 8 is a schematic diagram explaining a standard cell type that is used in a semiconductor device according to still another embodiment of the present inventive concept. Referring to FIG. 8, the standard cells used in a semiconductor device according to still another embodiment of the present inventive concept may include two or more standard cell types. In a standard cell region 120 of the memory device 100, a first type standard cell 123a and a second type standard cell 123b may be arranged. The first type standard cell 123a is a critical operational path standard cell, and may define a critical operational path for accessing a memory cell array 110. The second type standard cell 123b is a user defined path standard cell, and may define a user defined operational path for accessing the memory cell array 110. That is, the second type standard cell 123b may be implemented to perform an operation defined by a user. In some embodiments of the present inventive concept, the operation defined by the user may include any one of a memory copy operation, a pop count operation, and an auto read modify write operation.

Figure 9:
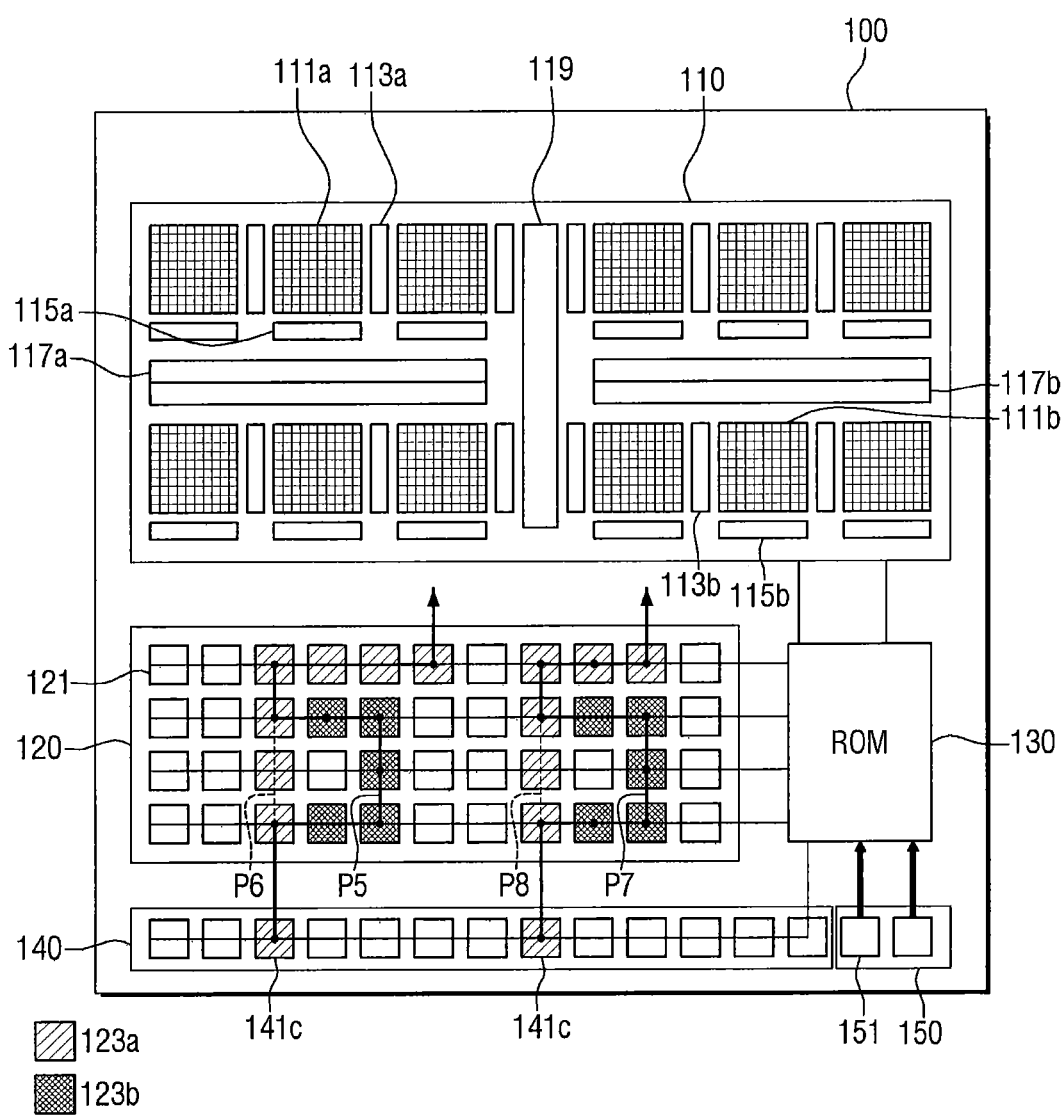
FIG. 9 is a schematic diagram explaining a semiconductor memory device according to still another embodiment of the present inventive concept.

FIG. 9 is a schematic diagram explaining a semiconductor device according to still another embodiment of the present inventive concept. Referring to FIG. 9, a semiconductor device 100 according to still another embodiment of the present inventive concept includes a critical operational path standard cell 123a and a user defined path standard cell 123b that are provided in a standard cell region 120. On the other hand, the semiconductor device 100 includes a 32-pin standard cell 141c that is an I/O pin standard cell provided in a first I/O region 140. Of course, the semiconductor device 100 may further include an additional standard cell that performs a different function from the function of the critical operational path standard cell 123a or the user defined path standard cell 123b provided in the standard cell region 120.

A program stored in a ROM 130 may define operational paths P5, P6, P7, and P8 of the semiconductor device through performing of place and route for any one of the critical operational standard cell 123a and the user defined path standard cell 123b and the additional standard cell. Here, in the case where the program performs the place and route in a normal mode, the program may define the operational paths P5 and P7 through performing of the place and route for the critical operational path standard cell 123a and the additional standard cell. In contrast, in the case where the program performs the place and route in a customized mode, the program may define the operational paths P6 and P8 through performing of the place and route for the user defined path standard cell 123b and the additional standard cell.

Figure 10:
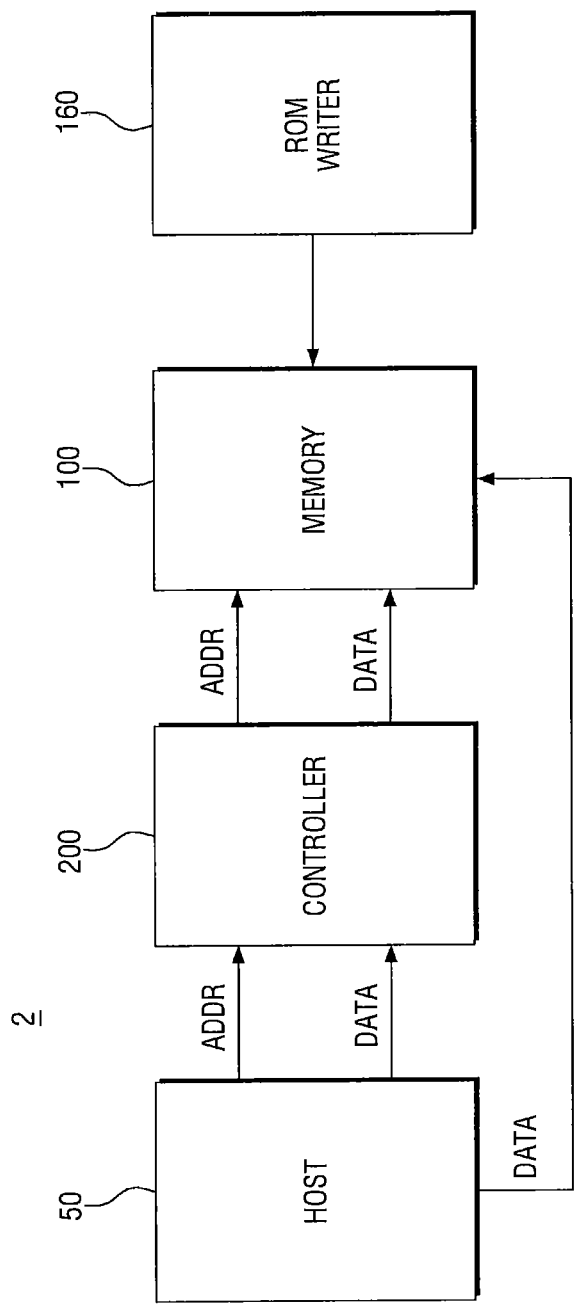
FIG. 10 is a schematic diagram explaining a semiconductor system according to another embodiment of the present inventive concept.

FIG. 10 is a schematic diagram explaining a semiconductor system according to another embodiment of the present inventive concept. Referring to FIG. 10, a semiconductor system 2 according to another embodiment of the present inventive concept is different from the semiconductor system 1 according to the embodiment as illustrated in FIG. 1 on the point that the semiconductor system 2 may further include a ROM writer 160.

The ROM writer 160 stores a program that performs place and route for a standard cell 121 arranged in a standard cell region 120 in a ROM 130. In some embodiments of the present inventive concept, storing of the program in the ROM 130 using the ROM writer 160 may be performed during manufacturing of the semiconductor device according to various embodiments of the present inventive concept. Alternatively, in some embodiments of the present inventive concept, the storing of the program in the ROM 130 using the ROM writer 160 may be formed while a user uses the semiconductor device 100 according to various embodiments of the present inventive concept.

Figure 11:
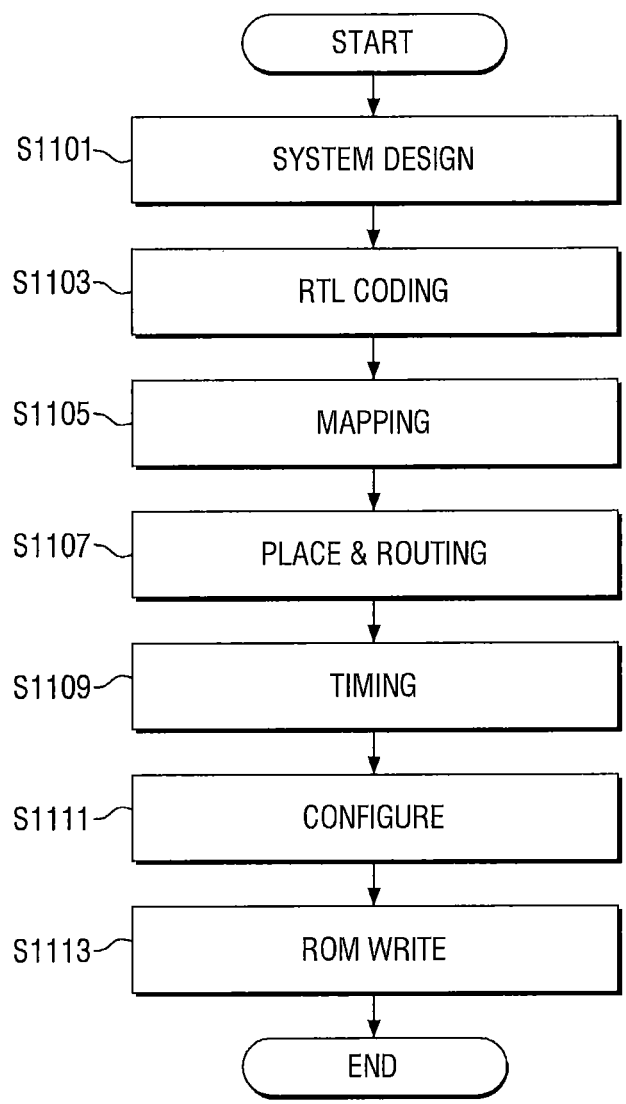
FIG. 11 is a schematic diagram explaining a method for operating a semiconductor device according to an embodiment of the present inventive concept.

FIG. 11 is a schematic diagram explaining a method for operating a semiconductor device according to an embodiment of the present inventive concept. Referring to FIG. 11, a method for operating a semiconductor device according to an embodiment of the present inventive concept includes performing a system design of a semiconductor device 100, specifically, a standard cell region 120 and an I/O region 140 (S11010), and performing an RTL coding based on the design (S1103).

The method further includes performing mapping and place and route to store the information (S1105 and S1107), and storing setting of timing for the operation of the semiconductor device 100. Then, the method further includes performing other environmental settings (S1111), and writing programs generated on the basis of works performed up to now in a ROM 130 of the semiconductor device 100 through a ROM writer 160 (S1113).

According to the semiconductor device and the semiconductor system according to various embodiments of the present inventive concept, the capacity or performance of the memory device, for example, the operating speed, operation latency, or power consumption of the memory device, can be easily controlled through programming of the operation of the memory device in accordance with various product requirements to which the semiconductor device and the semiconductor system are applied, without greatly deviating from the structure of the existing memory device.

Figure 12:
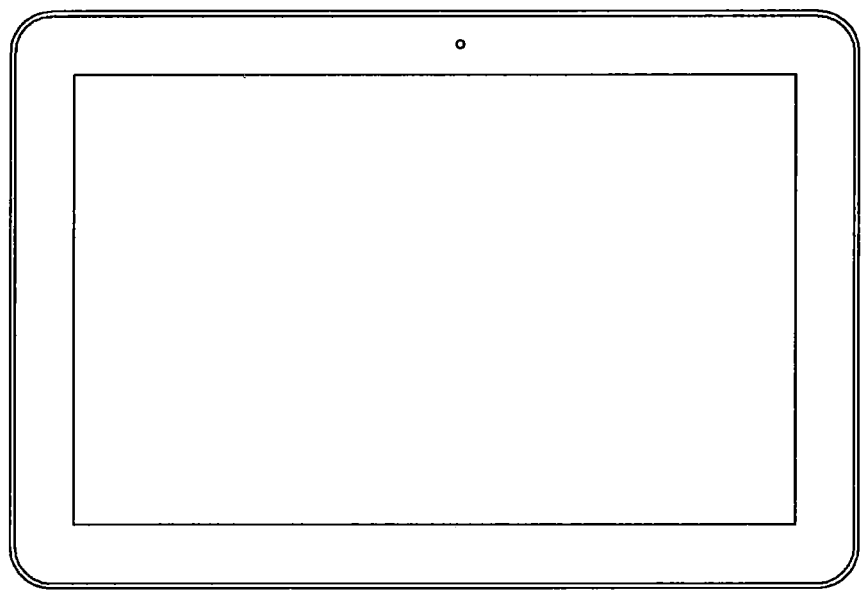
FIGS. 12 to 14 are views of exemplary semiconductor systems to which a semiconductor device and a semiconductor system according to some embodiments of the present inventive concept can be applied.
Figure 13:
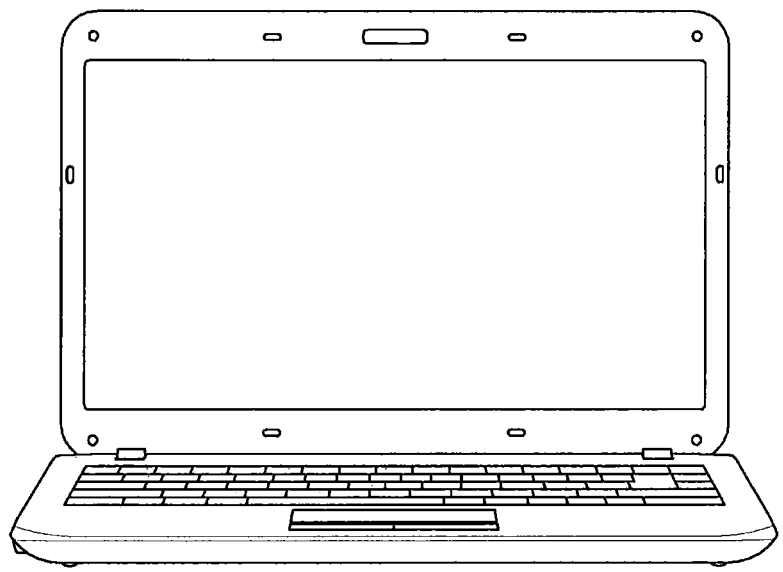
Figure 14:
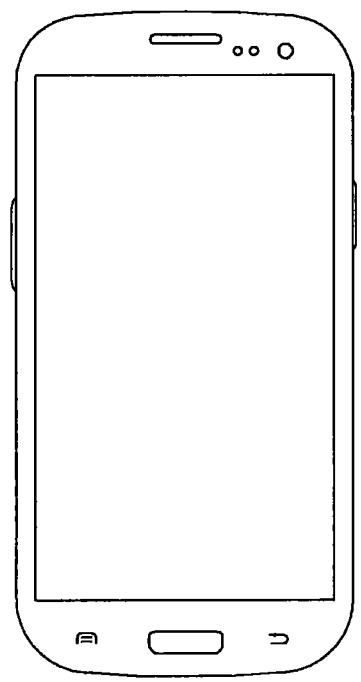

FIGS. 12 to 14 are views of exemplary semiconductor systems to which a semiconductor device and a semiconductor system according to some embodiments of the present inventive concept can be applied. FIG. 12 illustrates a tablet PC 1200, FIG. 13 illustrates a notebook computer 1300, and FIG. 14 illustrates a smart phone 1400. At least one of the semiconductor device and the semiconductor system according to the embodiments of the present inventive concept can be used in the tablet PC 1200, the notebook computer 1300, and the smart phone 1400 as described above.

Further, it is apparent to those of ordinary skill in the art that the semiconductor device and the semiconductor system according to some embodiments of the present inventive concept can also be applied to other non-exemplified integrated circuit devices. Although the tablet PC 1200, the notebook computer 1300, and the smart phone 1400 are exemplified as examples of the semiconductor device and the semiconductor system according to this embodiment, the scope of the present inventive concept is not limited thereto.

In some embodiments of the present inventive concept, the semiconductor device and the semiconductor system may be implemented by a computer, a UMPC (Ultra Mobile PC), a work station, a net-book, a PDA (Personal Digital Assistants), a portable computer, a wireless phone, a mobile phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, or a digital video player.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims.

What is claimed is:

1. An integrated circuit device, comprising:
a memory cell array in a semiconductor substrate; and
user-programmable standard cell logic electrically coupled to said memory cell array, said user-programmable standard cell logic comprising a first plurality of standard cells configured to support first write and/or first read operations in said memory cell array, which are selected based on a first program state of said user-programmable standard cell logic, and a second plurality of standard cells configured to support second write and/or second read operations in said memory cell array, which are selected based on a second program state of said user-programmable standard cell logic, said second write and/or second read operations having different performance characteristics relative to performance characteristics associated with the first write and/or first read operations.

2. The device of claim 1, wherein the first plurality of standard cells have at least different latency characteristics relative to the second plurality of standard cells.

3. The device of claim 1, wherein the first plurality of standard cells have at least different operating speed characteristics relative to the second plurality of standard cells.

4. The device of claim 1, wherein the first plurality of standard cells have at least different power consumption characteristics relative to the second plurality of standard cells.

5. The device of claim 1, wherein the first plurality of standard cells have different latency, operating speed and power consumption requirements relative to the second plurality of standard cells.

6. An integrated circuit device, comprising:
a memory cell array in a semiconductor substrate;
standard cell logic electrically coupled to said memory cell array, said standard cell logic comprising a first plurality of standard cells configured to support first write and/or first read operations in said memory cell array and a second plurality of standard cells configured to support second write and/or second read operations in said memory cell array having different performance characteristics relative to performance characteristics associated with the first write and/or first read operations;
a programmable read-only memory (PROM) electrically coupled to said standard cell logic;
input/output (I/O) pins; and
first I/O standard cells in said standard cell logic, said first I/O standard cells configured to establish a first number of the I/O pins as active and a second number of the I/O pins as inactive, in accordance with I/O pin programming information contained in said PROM.

7. The device of claim 6, wherein the first number is selected from a group consisting of 8, 16 and 32 and the second number is selected from a group consisting of 0, 16 and 24.

8. The device of claim 6, wherein said memory cell array comprises a plurality of memory banks; and wherein said standard cell logic comprises a memory bank standard cell logic configured to set a number of active memory banks in the plurality of memory banks, in response to programming information contained in said PROM.

9. An integrated circuit device, comprising:
a memory cell array in a semiconductor substrate having input/output pin cells thereon;
a programmable read-only memory (PROM) in the semiconductor substrate; and
standard cell logic electrically coupled to said memory cell array and said PROM, said standard cell logic comprising I/O standard cells, which are configured to establish a first number of said I/O pin cells as active and a second number of the I/O pin cells as inactive, in accordance with I/O pad programming information contained in said PROM.

10. The device of claim 9, wherein the first number is selected from a group consisting of 8, 16 and 32 and the second number is selected from a group consisting of 0, 16 and 24.

* * * * *